US012604456B2

(12) United States Patent
Shin et al.

(10) Patent No.: US 12,604,456 B2
(45) Date of Patent: Apr. 14, 2026

(54) SEMICONDUCTOR DEVICE AND METHOD FOR FABRICATING THE SAME

(71) Applicant: SK hynix Inc., Gyeonggi-do (KR)

(72) Inventors: Wan Sup Shin, Gyeonggi-do (KR);
Seung Wook Ryu, Gyeonggi-do (KR);
Seung Mi Yeo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 808 days.

(21) Appl. No.: 17/863,991

(22) Filed: Jul. 13, 2022

(65) Prior Publication Data

US 2023/0255015 A1     Aug. 10, 2023

(30) Foreign Application Priority Data

Feb. 10, 2022     (KR) ......................... 10-2022-0017586

(51) Int. Cl.
*H01L 27/108*          (2006.01)
*H10B 12/00*          (2023.01)

(52) U.S. Cl.
CPC ............. *H10B 12/30* (2023.02); *H10B 12/03* (2023.02); *H10B 12/05* (2023.02); *H10B 12/482* (2023.02)

(58) Field of Classification Search
CPC ........ H10B 12/30; H10B 12/03; H10B 12/05; H10B 12/482; H10B 12/50; H10B 12/488; H10B 12/0335; H10B 12/48
See application file for complete search history.

(56) References Cited

U.S. PATENT DOCUMENTS

| | | | |
|---|---|---|---|
| 2013/0240965 A1* | 9/2013 | Park | H10B 12/482 |
| | | | 257/E21.409 |
| 2019/0280005 A1* | 9/2019 | Bin | H10B 43/27 |
| 2020/0083225 A1 | 3/2020 | Ma et al. | |
| 2021/0012828 A1* | 1/2021 | Kim | G11C 11/4097 |
| 2021/0249415 A1* | 8/2021 | Kang | H10D 86/441 |
| 2023/0062524 A1* | 3/2023 | Liu | H10B 63/10 |
| 2023/0137340 A1* | 5/2023 | Kim | H10B 12/488 |
| | | | 438/253 |

FOREIGN PATENT DOCUMENTS

| | | |
|---|---|---|
| KR | 10-2001-0008450 A | 2/2001 |
| KR | 10-2021-0077098 A | 6/2021 |
| KR | 10-2021-0137123 A | 11/2021 |

OTHER PUBLICATIONS

Office Action for Korean Patent Application No. 10-2022-0017586 issued by the Korean Patent Office on Aug. 14, 2025.

* cited by examiner

*Primary Examiner* — Mohammed R Alam
(74) *Attorney, Agent, or Firm* — IP & T GROUP LLP

(57)          ABSTRACT

A semiconductor device includes: a substrate; a body recess in the substrate; a body dielectric layer over the body recess; an active layer extending in a direction parallel to the substrate over the substrate; a contact node over an end portion of the active layer and perpendicular to the substrate; and a conductive line coupled to the contact node and extended perpendicular to the substrate.

19 Claims, 24 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2022-0017586, filed on Feb. 10, 2022, which is incorporated herein by reference in its entirety.

BACKGROUND

1. Field

Exemplary embodiments of the present invention relate to a semiconductor device, and more particularly, to a semiconductor device having a three-dimensional structure and a method for fabricating the same.

2. Description of the Related Art

The size of a memory cell is being reduced continuously to increase the net die of a memory device. As the size of memory cells is miniaturized, it is required to reduce parasitic capacitance Cb and increase the capacitance as well. However, it is difficult to increase the net die due to the structural limitation of the memory cells.

Recently, three-dimensional semiconductor memory devices including memory cells have been suggested.

SUMMARY

Embodiments of the present invention are directed to a semiconductor device including highly integrated memory cells, and a method for fabricating the same.

In accordance with an embodiment of the present invention, a semiconductor device includes: a substrate; a body recess in the substrate; a body dielectric layer over the body recess; an active layer extending in a direction parallel to the substrate over the substrate; a contact node over an end portion of the active layer and perpendicular to the substrate; and a conductive line coupled to the contact node and extended perpendicular to the substrate.

In accordance with another embodiment of the present invention, a semiconductor device includes: a body recess in a substrate; a body dielectric layer over the body recess; a transistor extending in a direction parallel to the substrate over the substrate and including an active layer having a first end portion and a second end portion; a bit line contact node on a sidewall, an upper surface, and a lower surface of the first end portion; a bit line coupled to the bit line contact node and extended perpendicular to the substrate; a storage contact node on a sidewall, an upper surface, and a lower surface of the second end portion; and a capacitor coupled to the second end portion and the storage contact node.

In accordance with another embodiment of the present invention, a semiconductor device includes: a substrate including a peripheral circuit portion; a memory cell array including a conductive line including a contact pad side and a bonding pad side; a first bonding pad coupled to the bonding pad side of the conductive line; a second bonding pad disposed over the peripheral circuit portion and coupled to the first bonding pad; a body dielectric layer covering the contact pad side of the conductive line; and a conductive pad passing through the body dielectric layer and coupled to the contact pad side of the conductive line.

In accordance with yet another embodiment of the present invention, a method for fabricating a semiconductor device includes: forming a stack body including dielectric layers over a substrate, first sacrificial layers and second sacrificial layers between the dielectric layers, and active layers between the first sacrificial layers and the second sacrificial layers; forming an opening by etching the stack body; etching the substrate through the opening to form a body recess; forming a body dielectric layer over the body recess; replacing the first sacrificial layers and the second sacrificial layers with double word lines; exposing end portions of the active layers; and forming contact nodes coupled to the exposed end portions.

In accordance with still another embodiment of the present invention, a method for fabricating a semiconductor device includes: forming a memory cell array including a first substrate including a body dielectric layer and a vertical bit line including a contact pad side covered by the body dielectric layer and a bonding pad side disposed opposite to the contact pad side; forming a second substrate including a peripheral circuit portion; turning over the first substrate and bonding the bonding pad side of the vertical bit line to the peripheral circuit portion; selectively removing the first substrate; and forming a bit line pad coupled to a contact pad side of the vertical bit line. The body dielectric layer may include silicon oxide that covers the contact pad side of the vertical bit line.

DETAILED DESCRIPTION

Figure 1:
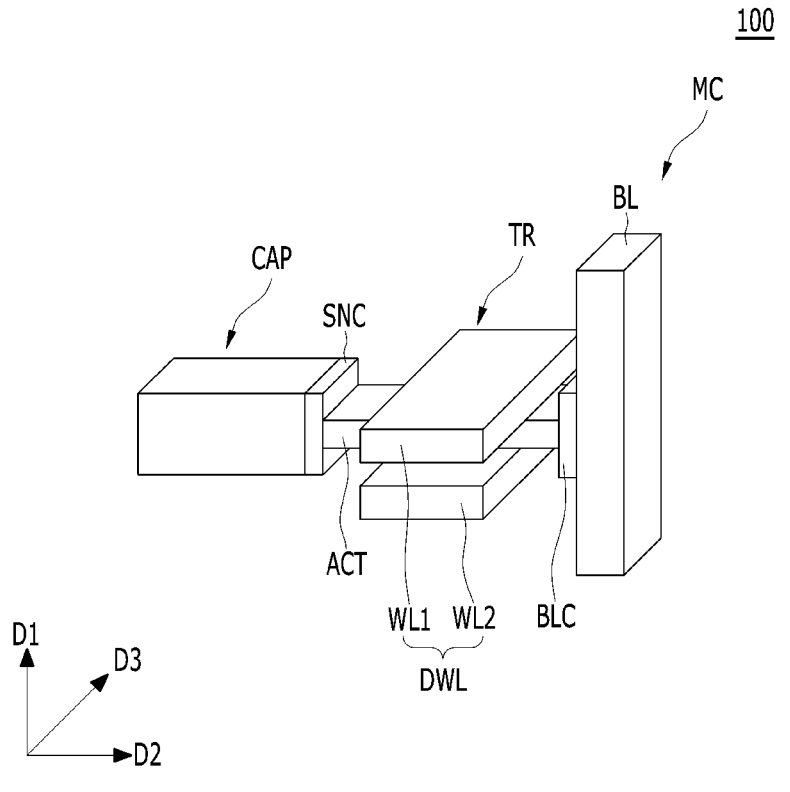
FIG. 1 is a schematic perspective view illustrating a semiconductor device in accordance with one of the embodiments of the present invention.

Embodiments of the present invention will be described below in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiment of the present invention, memory cell density may be increased and parasitic capacitance may be reduced by vertically stacking memory cells.

Figure 2:
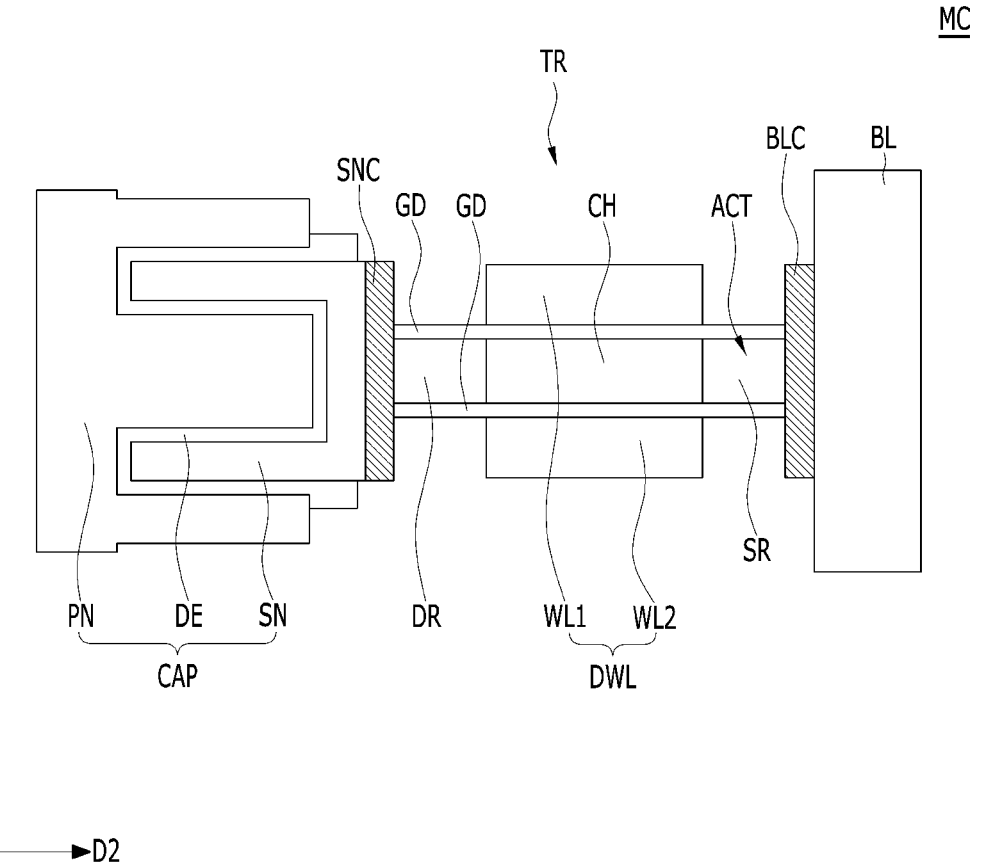
FIG. 2 is a schematic cross-sectional view illustrating the semiconductor device shown in FIG. 1.

FIG. 1 is a schematic perspective view illustrating a semiconductor device in accordance with an embodiment of the present invention. FIG. 2 is a schematic cross-sectional view illustrating a memory cell shown in FIG. 1.

Referring to FIGS. 1 and 2, the semiconductor device 100 in accordance with the embodiments of the present invention may include memory cells MC. Each of the memory cells MC may include a bit line BL, a transistor TR, and a capacitor CAP. The transistor TR may include active layer ACT and double word line DWL, and the double word line DWL may include first and second word lines WL1 and WL2. The first word line WL1 and the second word line WL2 are on opposite sides of the active layer ACT. The capacitor CAP may include a storage node SN, a dielectric layer DE, and a plate node PN.

The bit line BL may be a pillar extending along a first direction D1. The active layer ACT may be a bar extending along a second direction D2 perpendicular to the first direction D1. The double word line DWL may be lines extending in a third direction D3 perpendicular to the first and second directions D1 and D2. The plate node PN of the capacitor CAP may be coupled to a plate line PL.

The bit line BL may be vertically oriented in a first direction D1. The bit line BL may be referred to as a vertically oriented bit line or a pillar-type bit line. The bit line BL may include a conductive material. The bit line BL may include a silicon-based material, a metal-based material, or a combination thereof. In an embodiment, the bit line BL may include silicon, a metal, a metal nitride, a metal silicide, or a combination thereof. The bit line BL may include polysilicon, titanium nitride, tungsten, or a combination thereof. For example, the bit line BL may include polysilicon doped with an N-type impurity or titanium nitride (TIN). The bit line BL may include a TiN/W stack including titanium nitride and tungsten over titanium nitride.

The double word line DWL may extend in a third direction D3, and the active layer ACT may laterally extend in a second direction D2. The active layer ACT may be laterally arranged in the second direction D2 from the bit line BL. The double word line DWL may include a pair of word lines, a first word line WL1 and a second word line WL2. The first word line WL1 and the second word line WL2 may be disposed along the first direction D1 facing each other with the active layer ACT interposed therebetween. A gate dielectric layer GD may be formed on the surfaces of the active layer ACT perpendicular to the first direction D1.

The active layer ACT may include a semiconductor material or an oxide semiconductor material. For example, the active layer ACT may include monocrystalline silicon, germanium, silicon germanium, indium gallium zinc oxide (IGZO), or combinations thereof. The active layer ACT may include polysilicon or monocrystalline silicon. The active layer ACT may include a channel CH, a first source/drain region SR between the channel CH and a bit line BL, and a second source/drain region DR between the channel CH and a capacitor CAP. The channel CH may be defined between the first source/drain region SR and the second source/drain region DR.

The first source/drain region SR and the second source/drain region DR may be doped with impurities (or referred to as dopants) of the same conductivity type. The first source/drain region SR and the second source/drain region DR may be doped with an N-type impurity or a P-type impurity. The first source/drain region SR and the second source/drain region DR may include at least one impurity selected among arsenic (As), phosphorus (P), boron (B), indium (In), and combinations thereof. A first side of the first source/drain region SR may contact the bit line BL, and a second side of the first source/drain region SR may contact the channel CH. A first side of the second source/drain region DR may contact the storage node SN, and a second side of the second source/drain region DR may contact the channel CH. A length of the channel CH along the second direction D2 may be smaller than a length of the first and second source/drain regions SR and DR along the second direction D2. Alternatively, the length of the channel CH in the second direction D2 may be greater than the lengths of the first and second source/drain regions SR and DR in the second direction D2.

The transistor TR may be a cell transistor and it may have a double word line DWL. In the double word line DWL, the first word line WL1 and the second word line WL2 may have the same or different potentials (or referred to as voltages or driving voltages). For example, the first word line WL1 and the second word line WL2 may form a pair, and the same word line driving voltage may be applied to the first word line WL1 and the second word line WL2. The memory cell MC may have one or more pair(s) of word lines. For example, the memory cell MC may include a double word line DWL with the first word lines WL1 and the second word line WL2 disposed adjacent to one channel CH.

According to another embodiment of the present invention, the first word line WL1 and the second word line WL2 may have different potentials. For example, a word line driving voltage may be applied to the first word line WL1, and a ground voltage may be applied to the second word line WL2. The second word line WL2 with the ground voltage may be referred to as a back word line or a shield word line. According to another embodiment of the present invention, the ground voltage may be applied to the first word line WL1, and the word line driving voltage may be applied to the second word line WL2.

The active layer ACT may have a smaller thickness than those of the first and second word lines WL1 and WL2. In other words, the vertical thickness of the active layer ACT along the first direction D1 may be smaller than the vertical thickness of each of the first and second word lines WL1 and WL2 along the first direction D1. Such a thin active layer ACT may be referred to as a thin-body active layer. The thin-body active layer ACT may include a thin-body channel CH, and the thin-body channel CH may have a thickness of approximately 10 nm or less. According to another embodiment of the present invention, the channel CH may have the same vertical thickness along the first direction D1 as those of the first and second word lines WL1 and WL2.

The gate dielectric layer GD may include silicon oxide, silicon nitride, a metal oxide, a metal oxynitride, a metal silicate, a high-k material, a ferroelectric material, an anti-ferroelectric material or combination thereof. The gate dielectric layer GD may include $SiO_2$, $Si_3N_4$, $HfO_2$, $Al_2O_3$, $ZrO_2$, AlON, HfON, HfSiO, HfSiON, HfZrO, or combinations thereof.

The double word line DWL may include a metal, a metal mixture, a metal alloy, or a semiconductor material, or combinations thereof. The double word line DWL may include titanium nitride, tungsten, polysilicon, or combinations thereof. For example, the double word line DWL may include a TiN/W stack in which titanium nitride and tungsten are sequentially stacked. The double word line 20) DWL may include an N-type work function material or a P-type work function material. The N-type work function material may have a low work function of approximately 4.5 eV or less, and the P-type work function material may have a high work function of approximately 4.5 eV or more.

The capacitor CAP may be disposed on the opposite side of the transistor TR with respect to the bit line BL along the second direction D2. The capacitor CAP may include a storage node SN that extends laterally from the active layer ACT along the second direction D2. The capacitor CAP may further include a dielectric layer DE and a plate node PN over the storage node SN. The storage node SN, the dielectric layer DE, and the plate node PN may be arranged laterally along the second direction D2. The storage node SN may have a cylindrical shape with an axis oriented along the second direction D2. The dielectric layer DE may conformally cover the cylindrical inner wall and the cylindrical outer wall of the storage node SN. The plate node PN may extend to the cylindrical inner wall and the cylindrical outer wall of the storage node SN over the dielectric layer DE. The plate node PN may be coupled to the plate line PL. The storage node SN may be electrically connected to the second source/drain region DR.

The storage node SN may have a three-dimensional structure, and the storage node SN of the three-dimensional structure may have a lateral three-dimensional structure which is oriented in the second direction D2. As an example of the three-dimensional structure, the storage node SN may have a cylinder shape. According to another embodiment of the present invention, the storage node SN may have a pillar shape or a pylinder shape. The pylinder shape may refer to a structure in which a pillar shape and a cylinder shape are merged.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, a tungsten nitride/tungsten (WN/W) stack, or combinations thereof. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-filling material to fill the cylindrical interior of the storage node SN over the titanium nitride, and titanium nitride (TiN) may serve as a plate node PN of a capacitor CAP, and tungsten nitride may be a low-resistivity material.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) strontium titanium oxide ($SrTiO_3$), or combinations thereof. In an alternative embodiment, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may include aluminum oxide ($Al_2O_3$) stacked over zirconium oxide ($ZrO_2$). The ZAZ stack may include sequentially stacked zirconium oxide ($ZrO_2$), aluminum oxide ($Al_2O_3$), and zirconium oxide ($ZrO_2$). The ZA stack and the ZAZ stack may be referred to as a zirconium oxide ($ZrO_2$)-based layer. According to an alternative embodiment of the present invention, the dielectric layer DE may be formed of hafnium (Hf)-based oxide. The dielectric layer DE may have a stack structure including at least hafnium oxide ($HfO_2$). The stack structure including hafnium oxide ($HfO_2$) may include an HA ($HfO_2/Al_2O_3$) stack or a HAH ($HfO_2/Al_2O_3/HfO_2$) stack. The HA stack may include aluminum oxide ($Al_2O_3$) stacked over hafnium oxide ($HfO_2$). The HAH stack may include sequentially stacked hafnium oxide ($HfO_2$), aluminum oxide ($Al_2O_3$), and hafnium oxide ($HfO_2$). The HA stack and the HAH stack may be referred to as a hafnium oxide ($HfO_2$)-based layer. In the ZA stack, ZAZ stack, HA stack, and HAH stack, aluminum oxide ($Al_2O_3$) has a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material, where the high-bandgap material has a greater bandgap than the high-k material. The dielectric layer DE may include silicon oxide ($SiO_2$) as a high bandgap material other than aluminum oxide ($Al_2O_3$). Leakage current may be suppressed due to the high bandgap material included in the dielectric layer DE. The high-bandgap material may be thinner than the high-k material. According to an alternative embodiment of the present invention, the dielectric layer DE may include a laminated structure of alternately stacked high-k material and high-bandgap material. For example, it may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to an alternative embodiment of the present invention, the dielectric layer DE may include a stack structure, a laminated structure, or a mixed structure including zirconium oxide, hafnium oxide, and aluminum oxide.

According to an alternative embodiment of the present invention, the dielectric layer DE may include a ferroelectric material or an antiferroelectric material.

According to an alternative embodiment of the present invention, an interface control layer for improving leakage current may be further formed between the storage node SN and the dielectric layer DE. The interface control layer may include titanium oxide (TiO$_2$), niobium oxide, niobium nitride, or combinations thereof. The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with another data storage material. For example, the data storage material may be phase change materials, magnetic tunnel junctions (MTJ), or variable resistance materials.

A bit line contact node BLC may be formed between the first source/drain region SR of the active layer ACT and the bit line BL. A storage contact node SNC may be formed between the second source/drain region DR of the active layer ACT and the storage node SN of the capacitor CAP. The storage contact node SNC and the bit line contact node BLC may extend vertically along the first direction D1. The bit line contact node BLC and the storage contact node SNC may extend to adjacent end portions of the active layers ACT, thereby covering the upper and lower surfaces (surfaces perpendicular to the first direction D1) of the end portions of both sides of the active layers ACT. The bit line contact node BLC and the storage contact node SNC may have a height that fully covers the end portions of the active layer ACT. A combination of the bit line contact node BLC and the first source/drain region SR may form a T-shape in the planes perpendicular to the third direction D3. Similarly, the storage contact node SNC and the second source/drain region DR may form a T-shape in the planes perpendicular to the third direction D3. The bit line contact node BLC and the storage contact node SNC may cover portions of the adjacent surfaces of the active layer ACT perpendicular to the first direction D1. The bit line contact node BLC and the storage contact node SNC may be doped polysilicon. For example, the bit line contact node BLC and the storage contact node SNC may be polysilicon with doped N-type impurity such as phosphorous. The first and second source/drain regions SR and DR may include an impurity diffused from the bit line contact node BLC and the storage contact node SNC.

Figure 3:
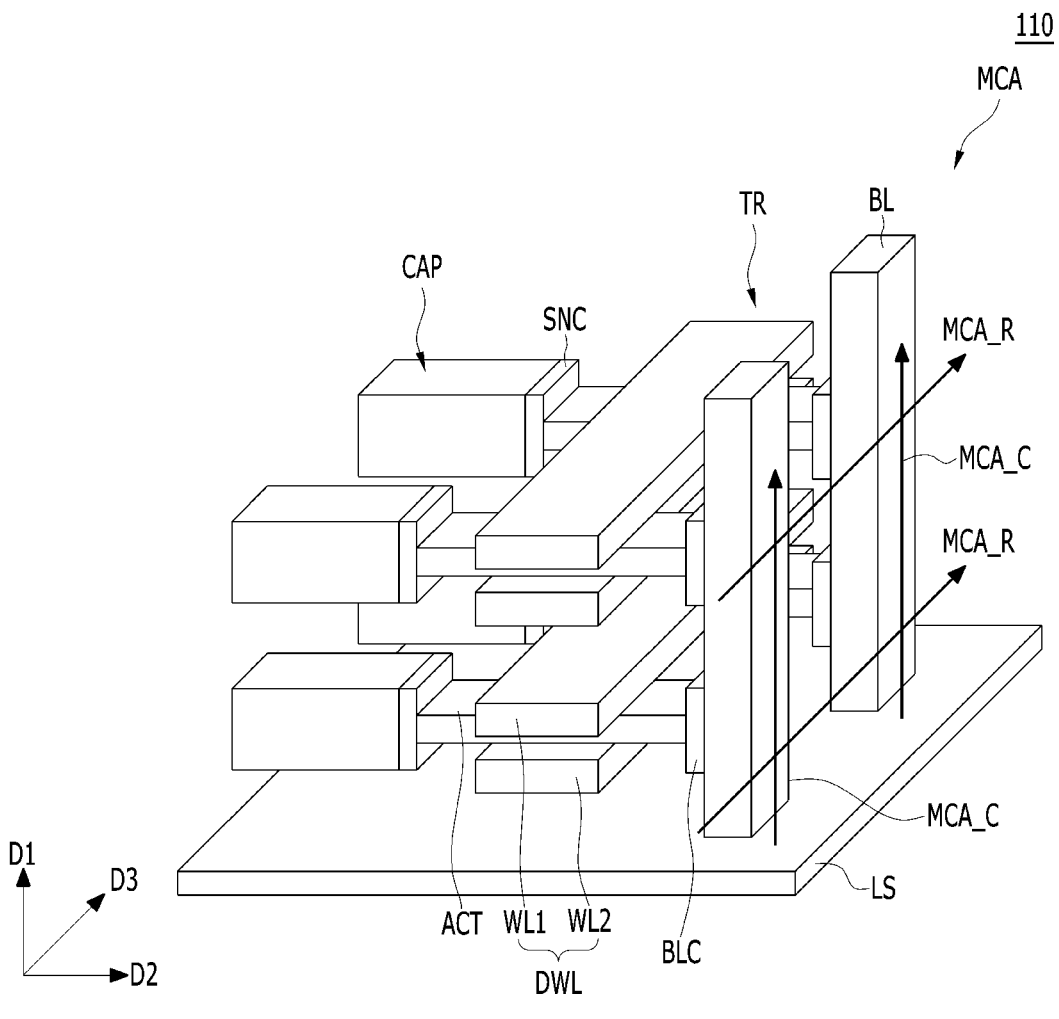
FIG. 3 is a schematic perspective view illustrating a semiconductor device in accordance with one of the embodiments of the present invention.
Figure 4:
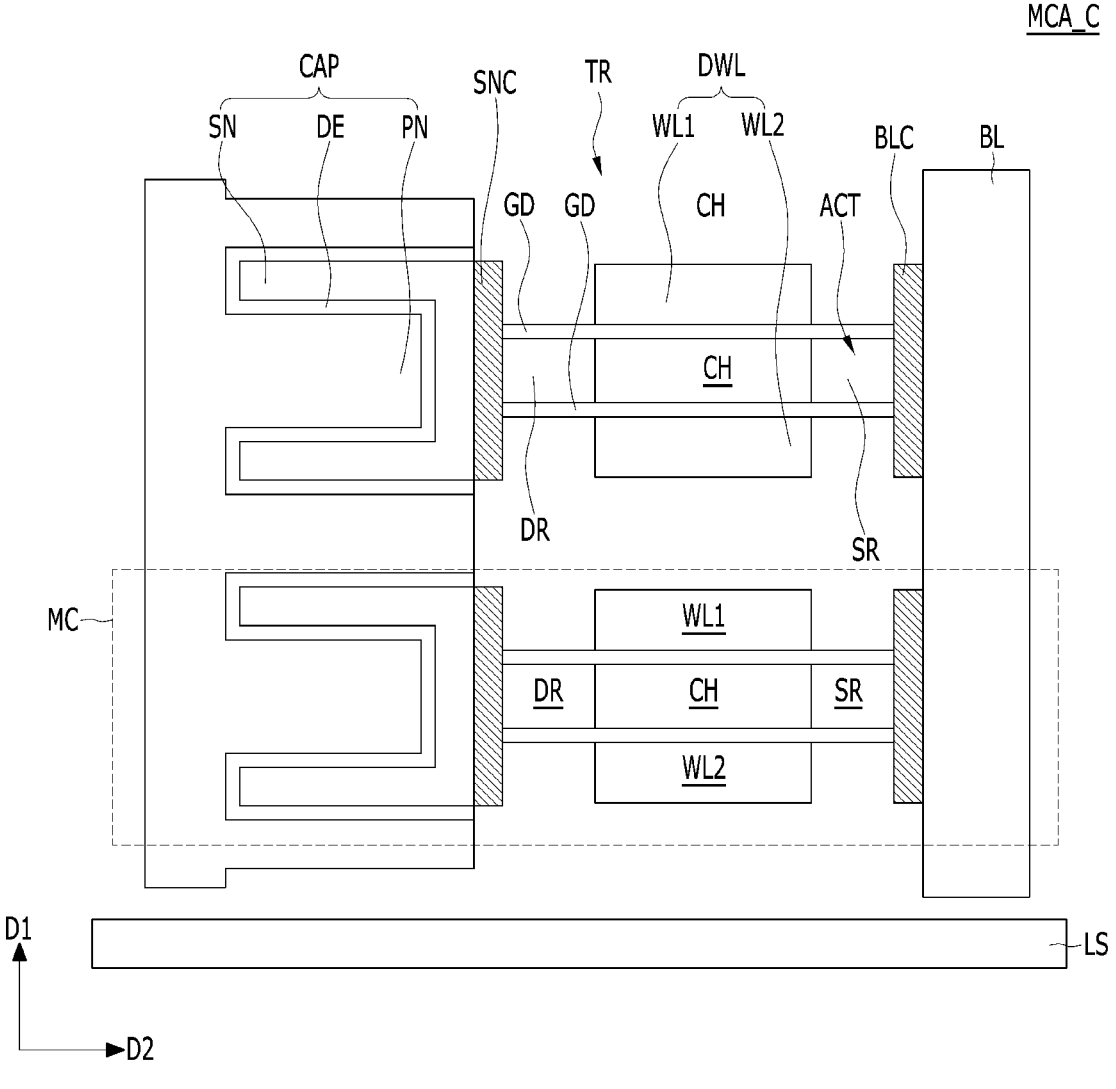
FIG. 4 is a schematic cross-sectional view illustrating the semiconductor device shown in FIG. 3.

FIG. 3 is a schematic perspective view illustrating a semiconductor device in accordance with an alternative embodiment of the present invention. FIG. 4 is a schematic cross-sectional view illustrating the semiconductor device shown in FIG. 3.

Referring to FIGS. 3 and 4, the semiconductor device 110 may include a memory cell array MCA. A plurality of the memory cells MC shown in FIG. 1 may be arranged in the first to third directions D1, D2, and D3 to form the memory cell array MCA shown in FIG. 3. The memory cell array MCA may include a three-dimensional array of memory cells MC, and the three-dimensional memory cell array MCA may include a vertical memory cell array MCA_C and a lateral memory array MCA_R. The vertical memory cell array MCA_C refers to an array of memory cells MC that are vertically arranged along the first direction D1. The lateral memory cell array MCA_R may refer to an array of memory cells MC that are arranged laterally along the third direction D3. The vertical memory cell array MCA_C may be alternatively referred to as a column array of memory cells MC, and the lateral memory cell array MCA_R may be alternatively referred to as a row array of memory cells MC. The bit line BL may be vertically oriented along the first direction D1 and coupled to the vertical memory cell array MCA_C, and the double word line DWL may be oriented laterally along the third direction D3 and coupled to the lateral memory cell array MCA_R. The bit line BL coupled to the vertical memory cell array MCA_C may be referred to as a common bit line, and the vertical memory cell arrays MCA_C that are disposed adjacent to each other in the third direction D3 may be coupled to different common bit lines. The double word line DWL coupled to the lateral memory cell array MCA_R may be referred to as a common double word line Common DWL, and the lateral memory cell arrays MCA_R that are disposed adjacent to each other in the first direction D1 may be coupled to different common double word lines.

The memory cell array MCA may include a plurality of memory cells MC, and each memory cell MC may include a vertically oriented (along the first direction D1) bit line BL, a laterally oriented (along the second direction D2) active layer ACT, a double word line DWL, and a laterally oriented (along the second direction D2) capacitor CAP. For example, FIG. 3 illustrates a three-dimensional DRAM memory cell array including four memory cells MC.

The active layers ACT that are disposed adjacent to each other in the first direction D1 may contact or share the same bit line BL. Active layers ACT that are disposed adjacent to each other in the third direction D3 may contact or share the same double word line DWL. The capacitors CAP may be respectively coupled to the active layers ACT. The capacitors CAP may share one plate line PL. The individual active layers ACT may be thinner than the first and second word lines WL1 and WL2 of the double word line DWL.

In the memory cell array MCA, a plurality of double word lines DWL may be vertically stacked along the first direction D1. Each double word line DWL may include a pair of a first word line WL1 and a second word line WL2. Between the first word line WL1 and the second word line WL2 of each double word line DWL, a plurality of active layers ACT may be laterally disposed and spaced apart from each other along the third direction D3. The channel CH of the active layer ACT may be disposed between the first word line WL1 and the second word line WL2.

The semiconductor device 110 may further include a lower structure LS, and the lower structure LS may include a substrate or a peripheral circuit portion. The bit line BL of the memory cell array MCA may be oriented vertically along the first direction D1 with respect to the surface of the lower structure LS, and the double word line DWL may be oriented parallel to the surface of the lower structure LS along the third direction D3.

When the lower structure LS includes the peripheral circuit portion, the peripheral circuit portion may be disposed lower than the memory cell array MCA along the first direction D1. This may be referred to as a COP (Cell over PERI) structure. The peripheral circuit portion may include at least one control circuit for driving the memory cell array MCA. The at least one control circuit of the peripheral circuit portion may include an N-channel transistor, a P-channel transistor, a CMOS circuit, or a combination thereof. The at least one control circuit of the peripheral circuit portion may include an address decoder circuit, a read circuit, a write circuit, and the like. At least one control circuit of the peripheral circuit portion may include a planar channel transistor, a recess channel transistor, a buried gate transistor, a fin channel transistors (FinFET), and the like.

According to an alternative embodiment of the present invention, the peripheral circuit portion of the semiconductor device 110 may be disposed higher than that of the memory cell array MCA along the first direction D1. This may be referred to as a POC (PERI over Cell) structure.

Figure 5:
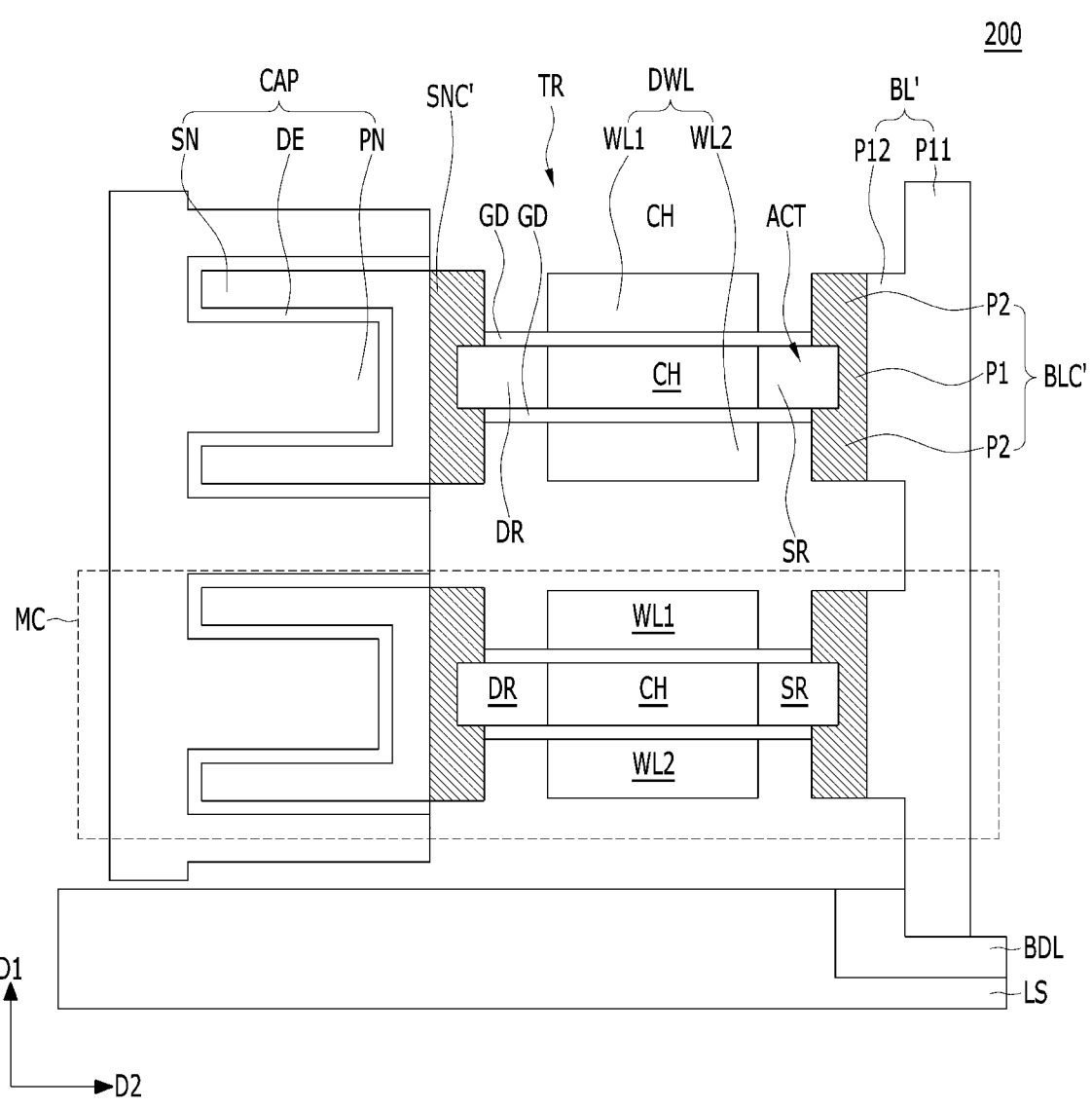
FIG. 5 is a schematic cross-sectional view illustrating a semiconductor device in accordance with one of the embodiments of the present invention.

FIG. 5 is a schematic cross-sectional view illustrating a semiconductor device in accordance with an alternative embodiment of the present invention.

Referring to FIG. 5, the semiconductor device 200 may be similar to the memory cell array MCA_C of FIG. 4. Hereinafter, detailed descriptions of the constituent elements also appearing in FIG. 4 will be omitted.

The semiconductor device 200 may include a lower structure LS, a bit line BL', a transistor TR, and a capacitor CAP. The transistor TR may include a double word line DWL and an active layer ACT. A bit line contact node BLC' may be formed between the first source/drain region SR of the active layer ACT and the bit line BL'. A storage contact node SNC' may be formed between the second source/drain region DR of the active layer ACT and the storage node SN of the capacitor CAP. The bit line contact node BLC' and the storage contact node SNC' may be doped polysilicon. For example, the bit line contact node BLC' and the storage contact node SNC' may be polysilicon with doped N-type impurity such as phosphorous The bit line contact node BLC' and the storage contact node SNC' may extend to adjacent end portions of the active layers ACT, thereby covering the surfaces perpendicular to the first direction D1 of the end portions. The bit line contact node BLC' and the storage contact node SNC' may extend to be formed on the upper and lower surfaces of the ends of both sides of the active layers ACT. A combination of the bit line contact node BLC' and the first source/drain region SR may form a lateral T-shape in the planes perpendicular to the third direction D3. The bit line contact node BLC' may cover the surfaces of the active layer ACT perpendicular to the first direction D1 and/or the second direction D2. The bit line contact node BLC' may cover the upper surface, the lower surface, and one side of the ends of one side of the active layer ACT.

The bit line contact node BLC' may include a first portion P1 and second portions P2. The first portion P1 may be in direct contact with the end of one side of the active layer ACT, and the second portion P2 may extend from the first portion P1 to partially cover the end of one side of the active layer ACT. The storage contact node SNC' may also have the same structure as that of the bit line contact node BLC'.

The bit line BL' may include a vertical extension P11 and a protrusion P12. The protrusion P12 may be disposed between the vertical extension portion P11 and the bit line contact node BLC'. The vertical extension P11 may be shared by the memory cells MC, and the protrusion portion P12 may be independently formed based on a memory cell MC unit.

A body dielectric layer BDL may be formed in the lower structure LS, and the body dielectric layer BDL and the bit line BL' may be in direct contact. The bit line BL' may extend vertically along the first direction D1 from the body dielectric layer BDL. The body dielectric layer BDL may include a dielectric material, such as silicon oxide.

FIGS. 6 to 19 are cross-sectional views of a semiconductor device during the intermediate stages of a method for fabricating a semiconductor device in accordance with an embodiment of the present invention. FIGS. 6 to 19 may illustrate an example method for fabricating the semiconductor device 200 shown in FIG. 5.

Figure 6:
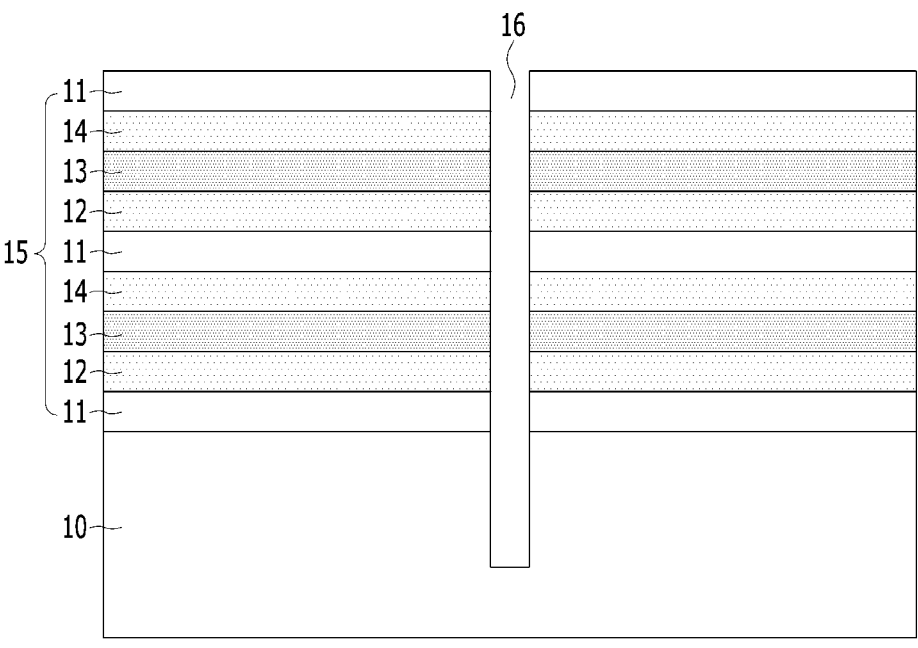
FIGS. 6 to 19 are cross-sectional views of a semiconductor device during the intermediate stages of a method for fabricating a semiconductor device in accordance with one of the embodiments of the present invention.

Referring to FIG. 6, a stack body 15 may be formed over the substrate 10. The substrate 10 may include a semiconductor substrate. In the stack body 15, sub-stacks may be alternately stacked. Here, the sub-stack may include dielectric layers 11, sacrificial layers 12 and 14, and active layers 13. The uppermost material of the stack body 15 may be the dielectric layer 11. The sacrificial layers 12 and 14 may include first sacrificial layers 12 and second sacrificial layers 14. The first sacrificial layers 12 and the second sacrificial layers 14 may be disposed between the dielectric layers 11, and the active layers 13 may be disposed between the first sacrificial layers 12 and the second sacrificial layers 14. The dielectric layers 11 may include silicon oxide, and the sacrificial layers 12 and 14 may include silicon nitride. The active layers 13 may include a semiconductor material or an oxide semiconductor material. The active layers 13 may include monocrystalline silicon, polysilicon, IGZO, or combinations thereof. According to an alternative embodiment of the present invention, the stack body 15 may be formed by alternately stacking a monocrystalline silicon layer and a silicon germanium layer and replacing the silicon germanium layer with a stack structure of silicon nitride and silicon oxide. Here, the monocrystalline silicon layer may correspond to the active layers 13, and the replaced silicon nitride may correspond to the sacrificial layers 12 and 14, and the replaced silicon oxide may correspond to the dielectric layers 11.

Subsequently, a portion of the stack body 15 may be etched to form a first opening 16. The first opening 16 may be a trench that vertically penetrates the stack body 15. The first opening 16 may extend into the substrate 10. A portion of the substrate 10 may be etched to extend the first opening 16.

Although not illustrated, a plurality of active layers 13 may be formed between the sacrificial layers 12 and 14. For example, similarly to the active layer ACT shown in FIG. 3, a plurality of active layers 13 may be laterally arranged on the same plane. For example, the step of forming the active layers 13 may include forming the stack body 15 in such a manner that the sacrificial layers 12 and 14 are disposed between the dielectric layers 11 and a planar semiconductor layer is disposed between the sacrificial layers 12 and 14, forming a plurality of isolation holes by etching the stack body 15, and forming a plurality of semiconductor layer patterns that are laterally arranged between the sacrificial layers 12 and 14 by recess-etching the planar semiconductor layer through the isolation holes.

Figure 7:
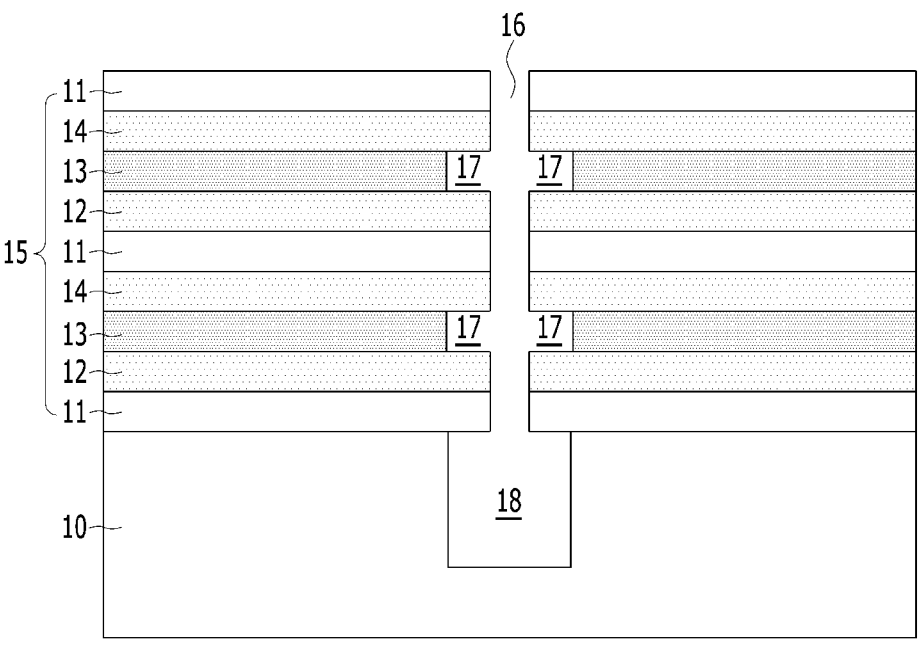

Referring to FIG. 7, the active layers 13 may be selectively etched partially or entirely to form recesses 17. A portion of the sacrificial layers 12 and 14 may be exposed in the recesses 17.

A body recess 18 may be formed in the substrate 10 during the recessing of the active layers 13. The width of the body recess 18 may be greater than the width of the first opening 16.

Figure 8:
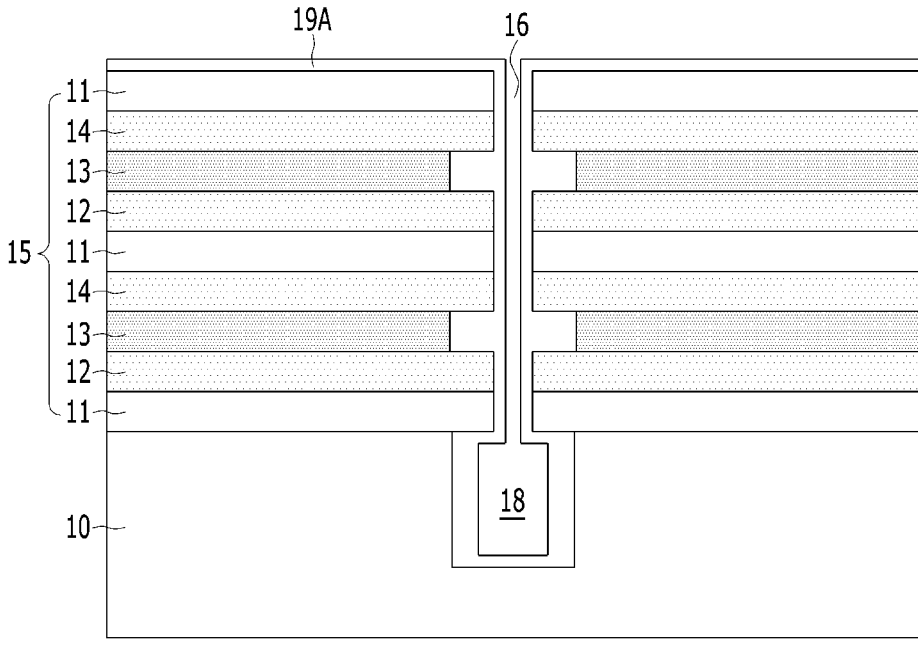
Figure 9:
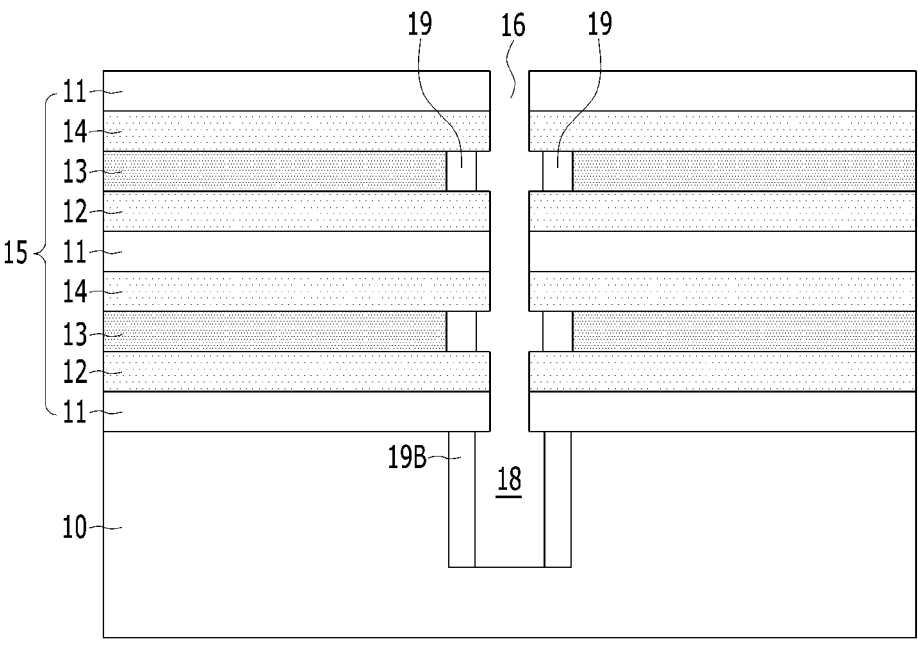

Referring to FIGS. 8 and 9, cap layers 19 that fill the recesses 17 may be formed. For example, the cap layers 19 may be formed by depositing a silicon nitride layer 19A in recess 17 and performing an etch-back process. A body spacer 19B may be formed on sidewalls of the body recess 18 by the etch-back process of the silicon nitride 19A. The body spacer 19B may partially expose the bottom surface of the body recess 18.

Figure 10:
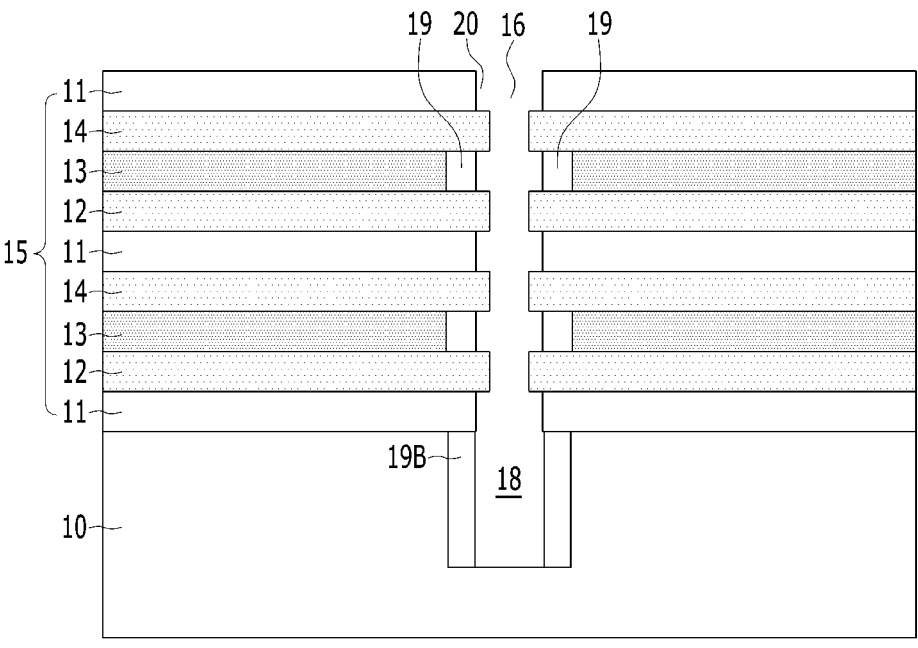

Referring to FIG. 10, the dielectric layers 11 may be laterally recessed to a predetermined depth from the first opening 16. As a result, portions of the first and second sacrificial layers 12 and 14 may be exposed in the edge recesses 20.

Figure 11:
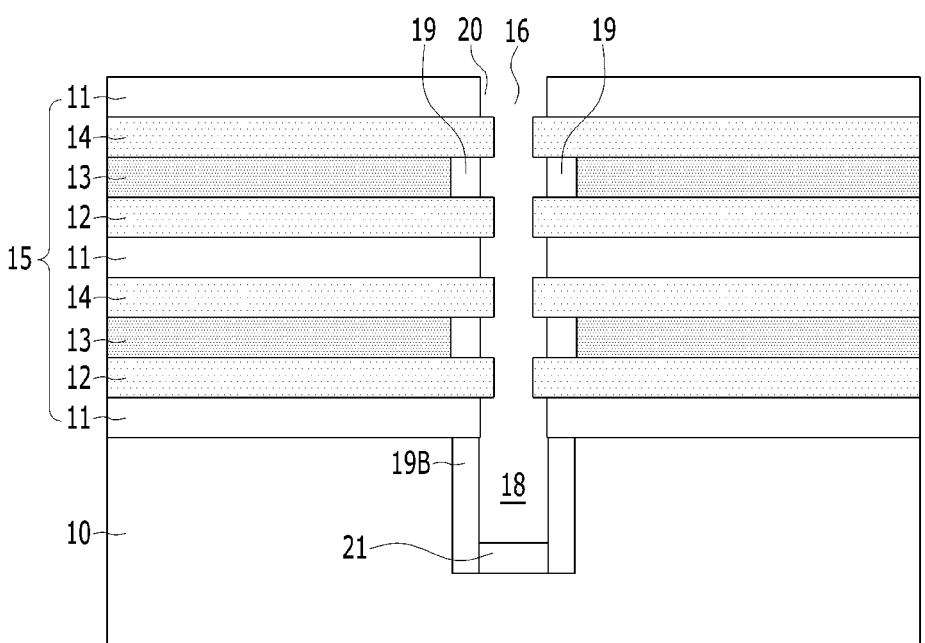

Referring to FIG. 11, a body protective layer 21 may be formed to partially fill the body recess 18. The body protective layer 21 may have an etch selectivity with respect to the body spacer 19B. The body protective layer 21 and the body spacer 19B may include different materials. The body protective layer 21 may include silicon oxide.

A method of forming the body protective layer 21 may include any suitable method. For example, the body protective layer 21 may be formed by an oxidation process or by an Area Selective Deposition (ASD) process. In an embodiment, the body protective layer 21 may be formed by performing an oxidation process. In another embodiment, the body protective layer 21 may be formed by an ASD process. The ASD process allows for selective deposition of the body protective layer 21.

Figure 12:
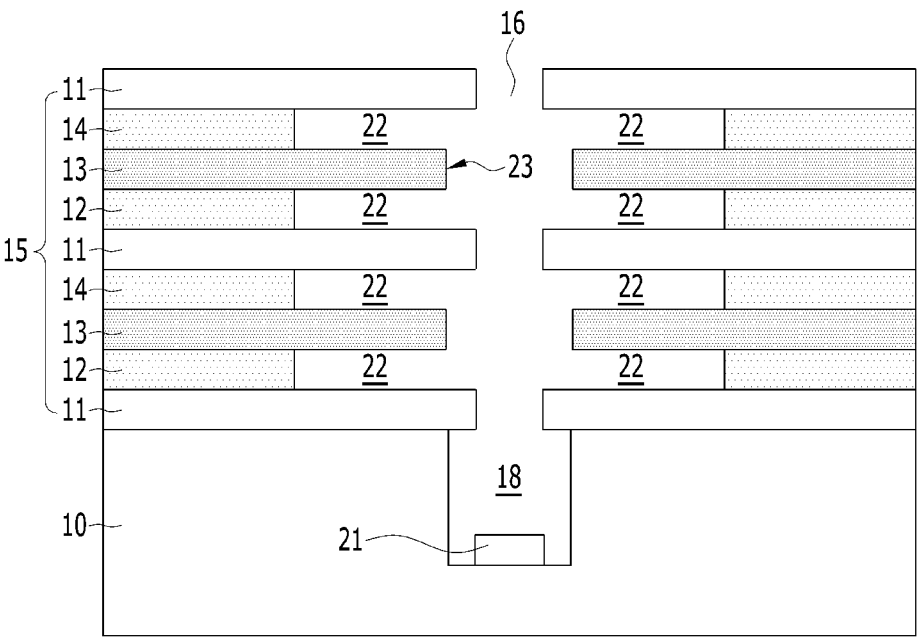

Referring to FIG. 12, the first and second sacrificial layers 12 and 14 may be recessed partially or entirely. As a result, gate recesses 22 may be formed over and below the active layers 13. The body spacer 19B and the cap layers 19 may also be removed while the sacrificial layers 12 and 14 are removed. As the cap layers 19 and the sacrificial layers 12 and 14 are recessed, the ends 23 of one side of the active layers 13 may be exposed. An end portion 23 of each of the active layers 13 proximal to the first opening 16 may be exposed in the gate recesses 22.

Figure 13:
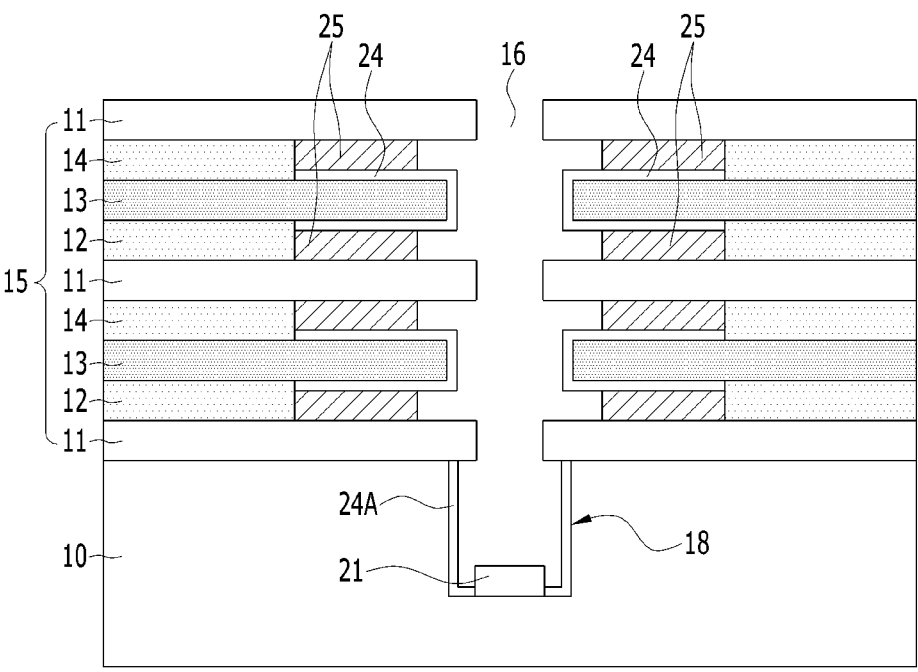

Referring to FIG. 13, gate dielectric layers 24 may be formed over the exposed end portions 23 of the active layers 13. The gate dielectric layers 24 may be selectively formed on the surfaces of the active layers 13 by an oxidation process. Alternatively, the gate dielectric layers 24 may be formed by a deposition process. The deposition process forms the gate dielectric layers 24 in the gate recesses 22 and over the exposed portions of the active layers 13.

A first body liner 24A may be formed on the surface of substrate 10 in the body recess 18 while the gate dielectric layers 24 are formed. The first body liner 24A may be formed by an oxidation process. The body protective layer 21 may remain on the surface of the substrate 10 in the body recess 18.

Subsequently, each of the gate recesses 22 may be filled with a conductive material to form double word lines 25. The double word lines 25 may include polysilicon, titanium nitride, tungsten, or combinations thereof. For example, the step of forming the double word lines 25 may include conformally depositing titanium nitride, depositing tungsten over the titanium nitride to fill the gate recesses 22, and performing an etch-back process on the titanium nitride and tungsten. The double word lines 25 may partially fill the gate recesses 22, and thus a portion of the gate dielectric layers 24 may be exposed in the gate recesses 22. The double word lines 25 may align vertically and may be spaced apart by the active layer 13. Alternatively, a single word line or a gate-all-around word line may be formed.

Referring to FIGS. 6 to 13, portions of the first sacrificial layers 12 and portions of the second sacrificial layers 14 are replaced by the double word lines 25.

Figure 14:
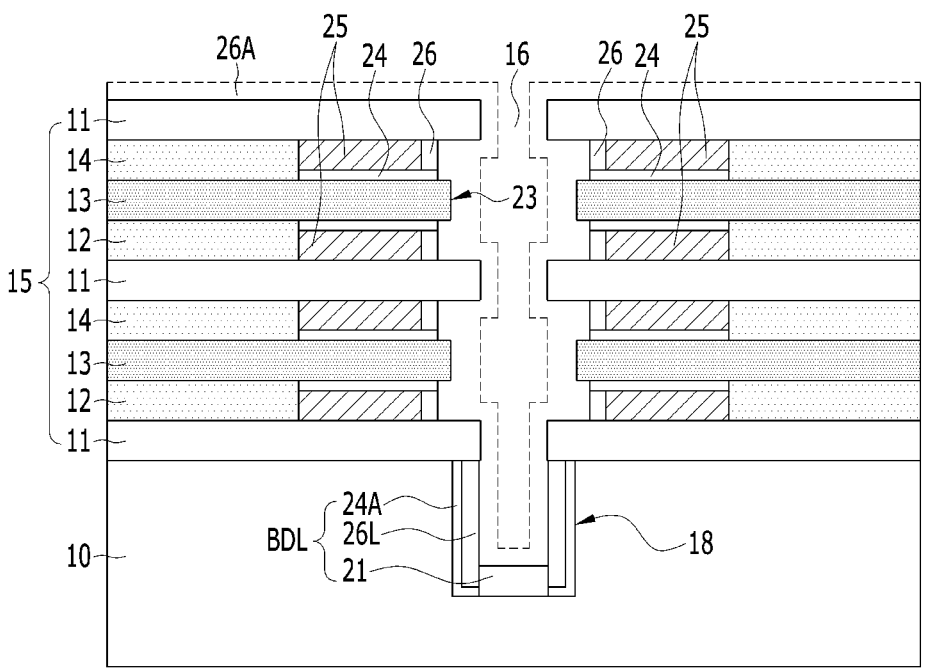

Referring to FIG. 14, liner layers 26 contacting one side of the double word lines 25 may be formed. The liner layers 26 may be disposed in the inside of the gate recesses 22. The liner layers 26 may include silicon oxide or silicon nitride. The liner layers 26 may expose portions of the gate recesses 22. In other words, a space (or an air gap) may be formed on one side of the liner layers 26. For example, the liner layers 26 may be formed by depositing silicon oxide 26A and performing an etch-back process. A second body liner 26L may be formed while the liner layers 26 are formed.

The body dielectric layer BDL may include the body protective layer 21, the first body liner 24A, and the second body liner 26L. The first body liner 24A and the second body liner 26L may include silicon oxide, and the body protective layer 21 may include silicon nitride.

Subsequently, a portion of the gate dielectric layer 24 exposed in the first opening 16 may be etched to expose the end portions 23 of the active layers 13.

Figure 15:
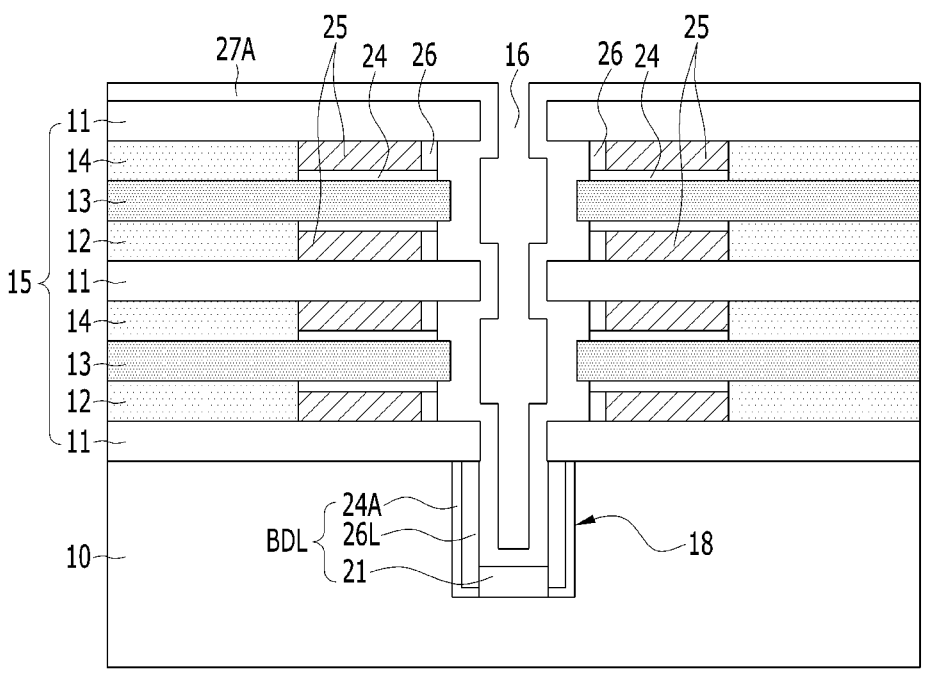

Referring to FIG. 15, a conductive layer 27A including an impurity (e.g., dopant) may be formed. The conductive layer 27A may be polysilicon containing an N-type impurity such as phosphorous. A portion of the conductive layer 27A may fill the space (or air gap) adjacent to the liner layers 26. The conductive layer 27A directly contacts the end portions 23 of the active layers 13.

Although not illustrated, heat treatment may be performed after the formation of the conductive layer 27A. Impurities may be diffused from the conductive layer 27A into the end portions 23 of the active layers 13 by the heat treatment. The diffused impurities may form the first source/drain regions SR shown in FIGS. 1 to 5.

Figure 16:
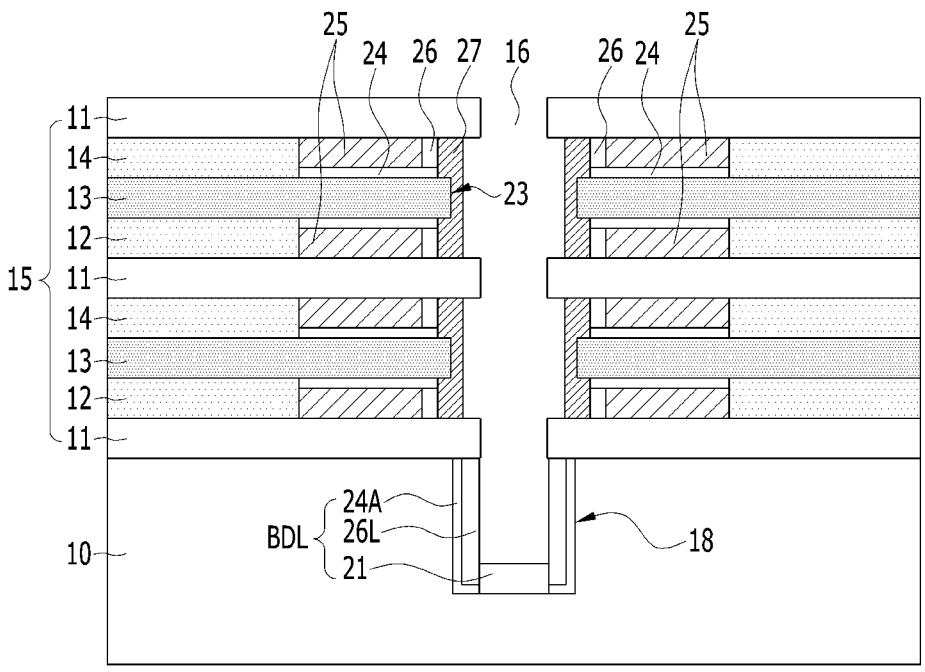

Referring to FIG. 16, the conductive layer 27A may be recessed to form contact nodes 27. The contact nodes 27 may fill the space (or air gap) adjacent to the liner layers 26. The contact nodes 27 may extend to the upper and lower surfaces of the end portions 23 of the active layers 13. The contact nodes 27 and the active layers 13 form a lateral T-shape. The contact nodes 27 may cover the upper surface, the lower surface, and the end portions 23 of the active layers 13. Contact nodes 27 may be referred to as bit line contact nodes or storage contact nodes. The contact nodes 27 may correspond to the bit line contact nodes BLC and BLC' shown in FIGS. 1 to 5.

Figure 17:
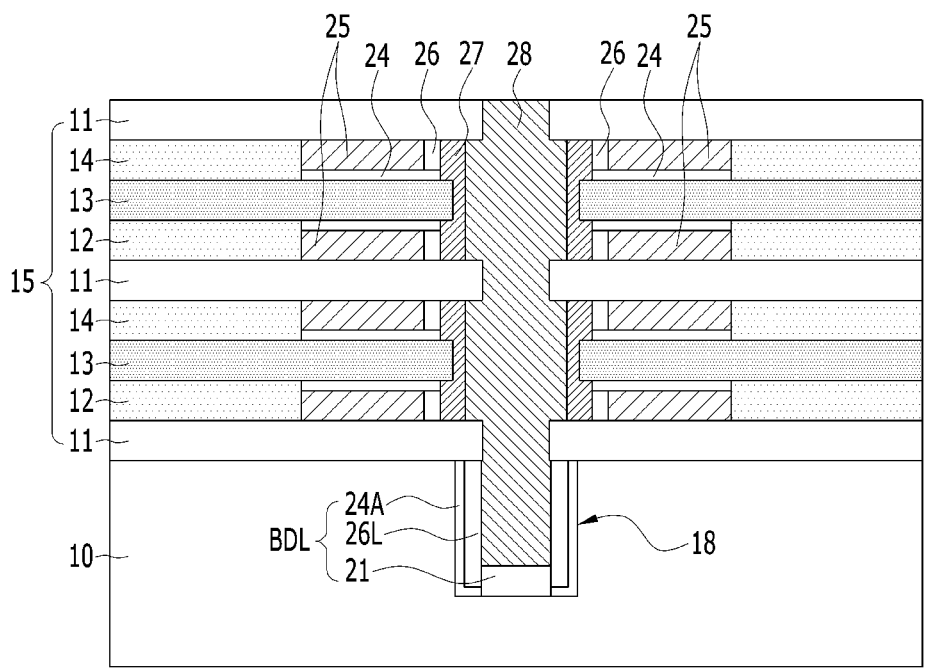

Referring to FIG. 17, a conductive line 28 coupled to the contact nodes 27 may be formed in the first opening 16. The conductive line 28 may be referred to as a vertical conductive line. The conductive line 28 may include a metal-based material. The conductive line 28 may correspond to the bit lines BL and BL' shown in FIGS. 1 to 5. The conductive line 28 may directly contact the body protective layer 21 and may extend vertically over the body protective layer 21. The contact nodes 27 may be coupled to the same conductive line 28. The substrate 10 and the conductive line 28 may be electrically isolated from each other by the body dielectric layer BDL, that is, the body protective layer 21, the first body liner 24A, and the second body liner 26L.

Figure 18:
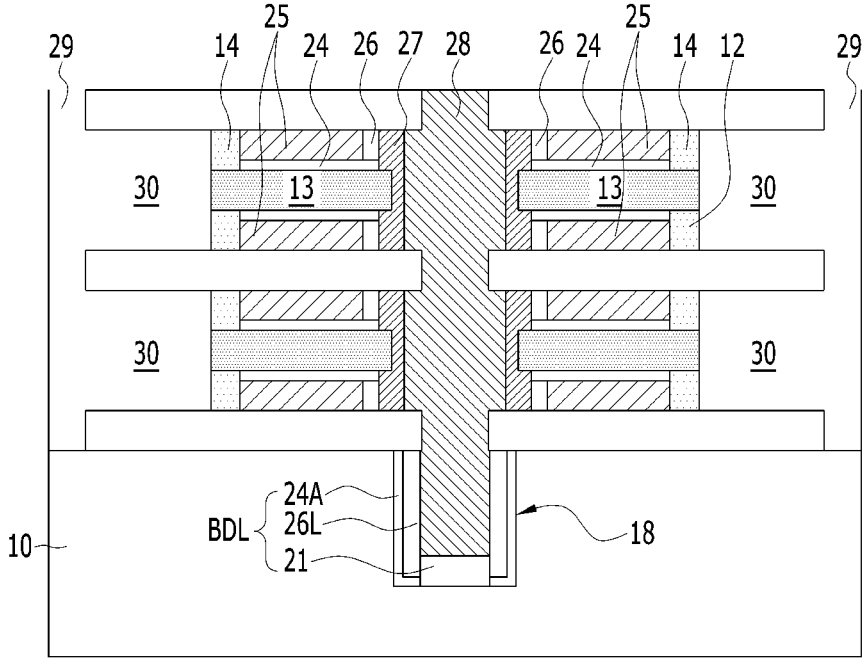

Referring to FIG. 18, portions of the stack body 15 at the opposite sides of the conductive line 28 may be etched to form second openings 29. Subsequently, the first and second sacrificial layers 12 and 14 and the active layers 13 may be recessed through the second openings 29. As a result, capacitor openings 30 may be formed. The sacrificial layers 12 and 14 may remain on the other sides of the double word line 25.

The double word lines 25 may be formed with the individual active layer 13 interposed therebetween, and the gate dielectric layers 24 may be formed between the double word line 25 and the active layer 13. The contact nodes 27 may be coupled to the end portions 23 of the active layers 13. The liner layers 26 may be formed between the contact nodes 27 and the double word line 25.

After the capacitor openings 30 are formed, polysilicon doped with an N-type impurity may be deposited over the sidewalls of the active layers 13, as well as other components exposed in the capacitor openings 30. A heat treatment process may be performed. As a result, impurities may diffuse into the ends of the other side of the active layers 13. The diffused impurities may form the second source/drain regions DR shown in FIGS. 1 to 5. The polysilicon doped with an N-type impurity may be etched to remain in the same shape as that of the contact nodes 27 of FIG. 16. The polysilicon doped with an N-type impurity may correspond to the storage contact nodes SNC and SNC' shown in FIGS. 1 to 5.

Figure 19:
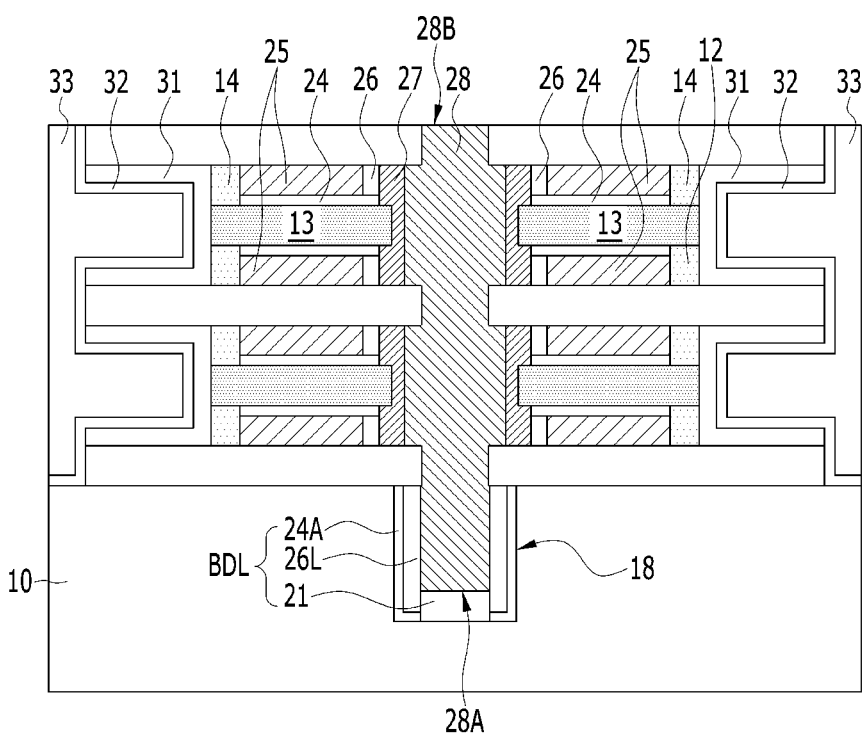

Referring to FIG. 19, a capacitor including a storage node 31, a dielectric layer 32, and a plate node 33 may be sequentially formed.

The bit line 28 may include a contact pad side 28A covered by a body dielectric layer BDL and a bonding pad side 28B distal to the contact pad side 28A.

Referring to FIGS. 6 to 19, the semiconductor device may include a substrate 10, a body recess 18 in the substrate 10, a body dielectric layer BDL in the body recess 18, an active layer 13 over and parallel to the substrate 10, a contact node 27 perpendicular to the active layers 13, and a bit line 28 coupled to the contact nodes 27 and extending vertically upwards from the body dielectric layer BDL.

In the above-described embodiments of the present invention, the body dielectric layer BDL is formed at the end of the bit line 28 in the substrate 10. Such configuration of the body dielectric layer BDL helps prevent an electrical bridge between the bit line 28 and the substrate 10 and between adjacent bit lines 28, thereby reducing or eliminating leakage current to the substrate 10. Accordingly, it is possible to control the leakage current to the substrate 10. Also, it is possible to prevent an electrical bridge between the neighboring bit lines 28.

FIGS. 20 to 24 are cross-sectional views illustrating an example of a method for fabricating a semiconductor device in accordance with another embodiment of the present invention. FIGS. 20 to 24 illustrate a method of coupling a memory cell array and a peripheral circuit portion to each other by wafer bonding.

Figure 20:
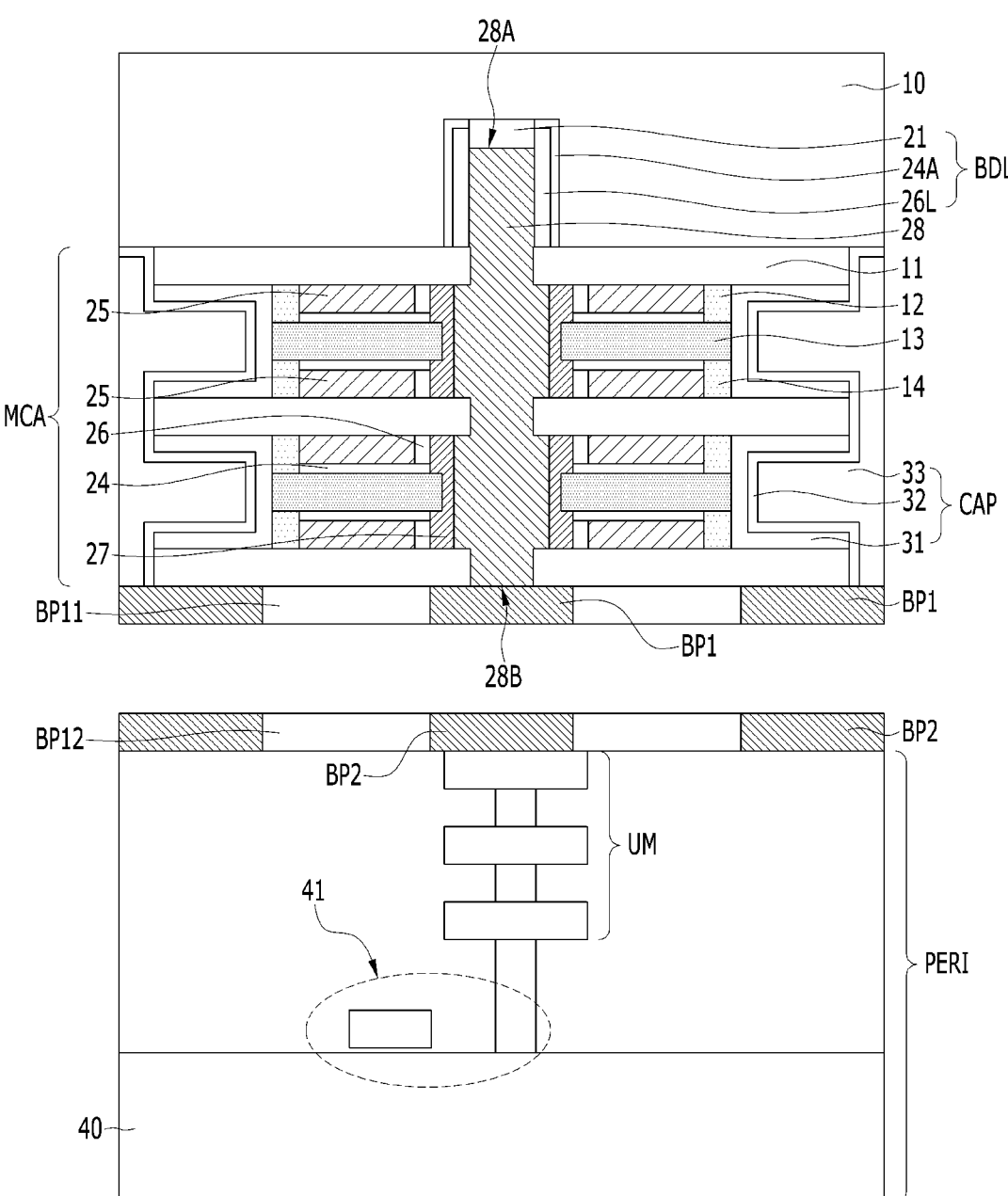
FIGS. 20 to 24 are cross-sectional views of a semiconductor device during the intermediate stages of a method for fabricating a semiconductor device in accordance with another embodiment of the present invention.

Referring to FIG. 20, a plurality of first bonding pads BP1 and a first bonding dielectric layer BP11 may be formed. The first bonding pads BP1 may be coupled to the bit line 28 and the plate node 33. The first bonding dielectric layer BP11 may be disposed between the first bonding pads BP1. The first bonding dielectric layer BP11 may expose the surface of the first bonding pads BP1.

In the embodiment illustrated in FIG. 20, the bit line 28 and the capacitors CAP may be disposed below the substrate 10. The first bonding pads BP1 and the first bonding dielectric layer BP11 may be disposed below the memory cell array MCA accordingly. The memory cell array MCA may be formed according to the process of FIGS. 6 to 19. The substrate 10 may be referred to as a 'first substrate 10'. The storage node 31, the dielectric layer 32, and the plate node 33 may form a capacitor CAP.

The bit line 28 may include a contact pad side 28A which is covered by the body dielectric layer BDL and a bonding pad side 28B which faces the contact pad side 28A.

Subsequently, a peripheral circuit portion PERI may be prepared. The peripheral circuit portion PERI may include a second substrate 40 and peripheral circuit transistors 41. The peripheral circuit portion PERI may further include a multi-level metal interconnection UM, and the multi-level metal interconnection UM may be coupled to the peripheral circuit transistors 41. The peripheral circuit transistors 41 may be part of a sense amplifier. Although not illustrated, the peripheral circuit portion PERI may further include a multi-level metal interconnection which is coupled to the plate nodes 33 and peripheral circuit transistors which is coupled to the multi-level metal interconnection. The peripheral circuit portion PERI may further include a multi-level metal interconnection coupled to the double word lines 25 and sub-word line drivers coupled to the multi-level metal interconnection.

A plurality of second bonding pads BP2 and a second bonding dielectric layer BP12 may be formed. The second bonding pads BP2 may be coupled to the multi-level metal interconnection UM of the peripheral circuit portion PERI. The second bonding dielectric layer BP12 may be disposed between the second bonding pads BP2. The second bonding pads BP2 are embedded in the second bonding dielectric layer BP12 with portions of the surfaces exposed beyond the second bonding dielectric layer BP 12.

The first and second bonding pads BP1 and BP2 may include a metal-based material. The first and second bonding dielectric layers BP11 and BP12 may include silicon oxide, silicon nitride, or combinations thereof.

The memory cell array MCA may be disposed over the peripheral circuit portion PERI.

Figure 21:
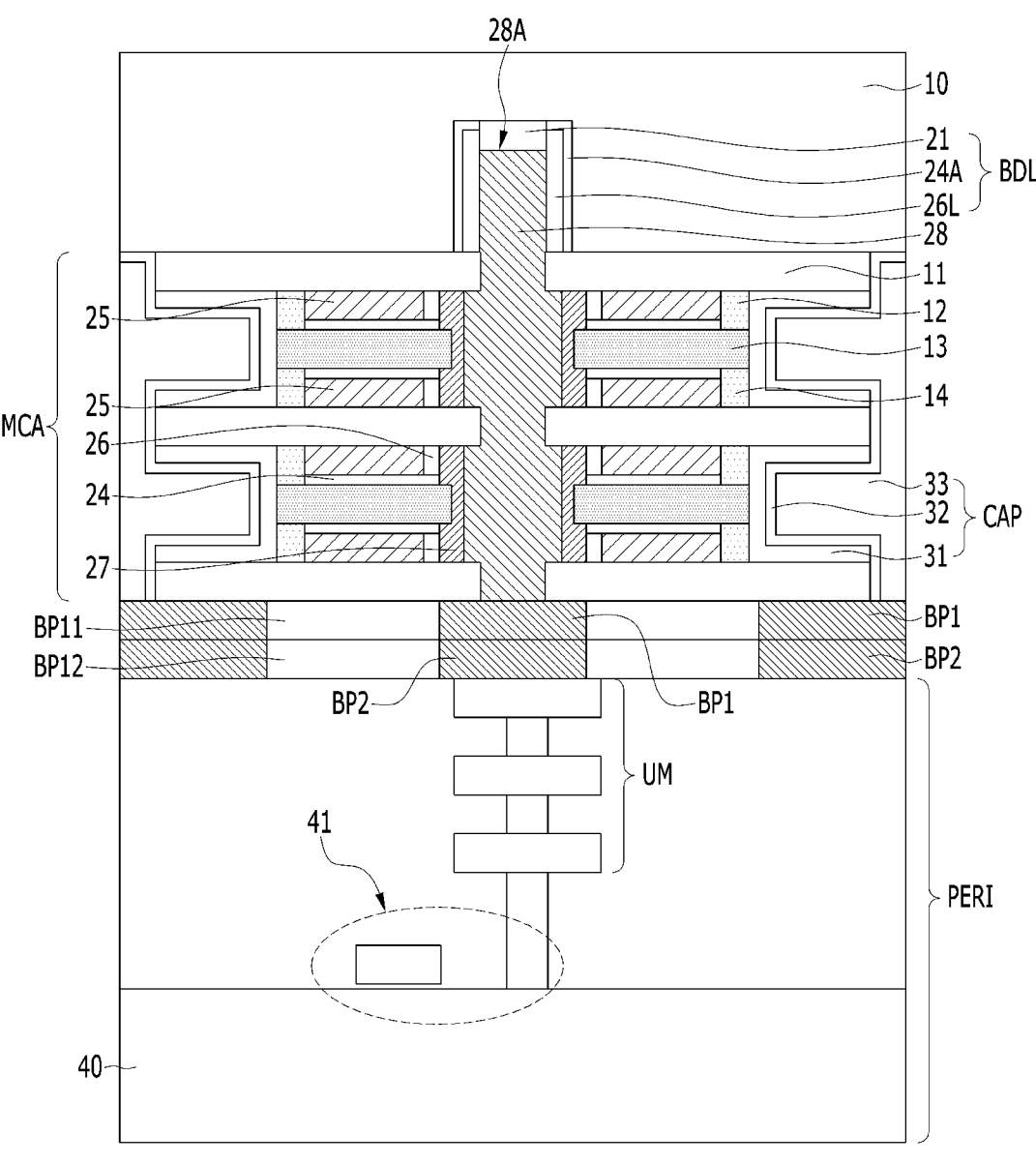

Referring to FIG. 21, the memory cell array MCA and the peripheral circuit portion PERI may be coupled to each other by wafer bonding. In the wafer bonding process, the first bonding pads BP1 and the second bonding pads BP2 may be bonded together; and the first bonding dielectric layer BP11 and the second bonding dielectric layer BP12 may be bonded together. In an embodiment, metal-to-metal bonding, hybrid bonding, and the like may be used. Metal-to-metal bonding may refer to bonding of the first bonding pads BP1 and the second bonding pads BP2. Hybrid bonding may refer to a bonding method that further includes bonding of the first bonding dielectric layer BP11 and the second bonding dielectric layer BP12 in addition to the metal-to-metal bonding. The bonding pad side 28B of the bit line 28 may be coupled to the peripheral circuit portion PERI by the first bonding pads BP1 and the second bonding pads BP2.

As described above, after the peripheral circuit portion PERI and the memory cell array MCA are separately formed, they may be bonded by wafer bonding. The body dielectric layer BDL may be applied as a material for protecting the bit line 28 during the wafer bonding.

Figure 22:
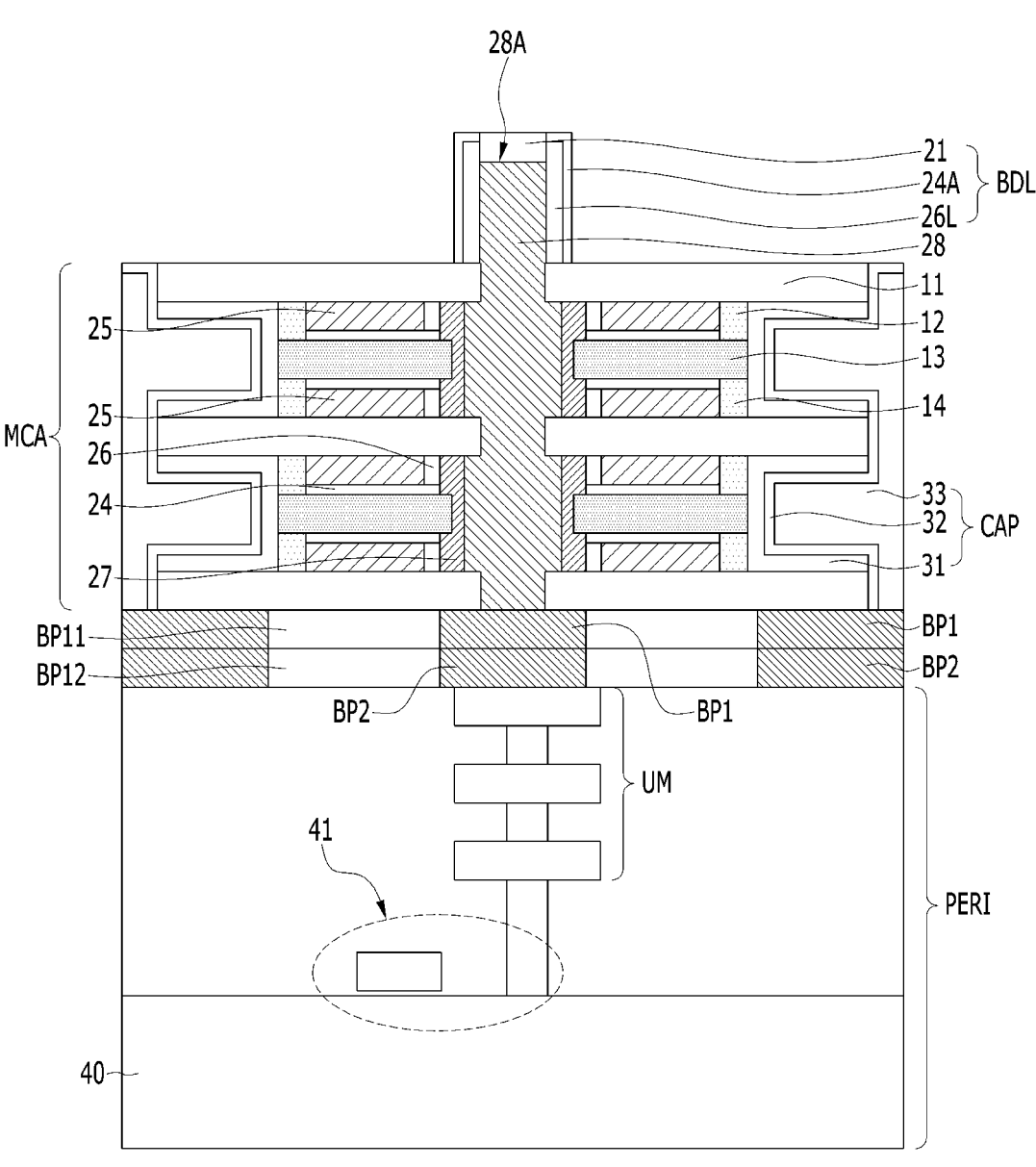

Referring to FIG. 22, the first substrate 10 may be selectively stripped. The stripping process of the first substrate 10 may use wet etching capable of selectively stripping silicon. During the wet etching of the first substrate 10, the body dielectric layer BDL may serve as an etch-stopping barrier to protect the bit line 28 from being etched.

Figure 23:
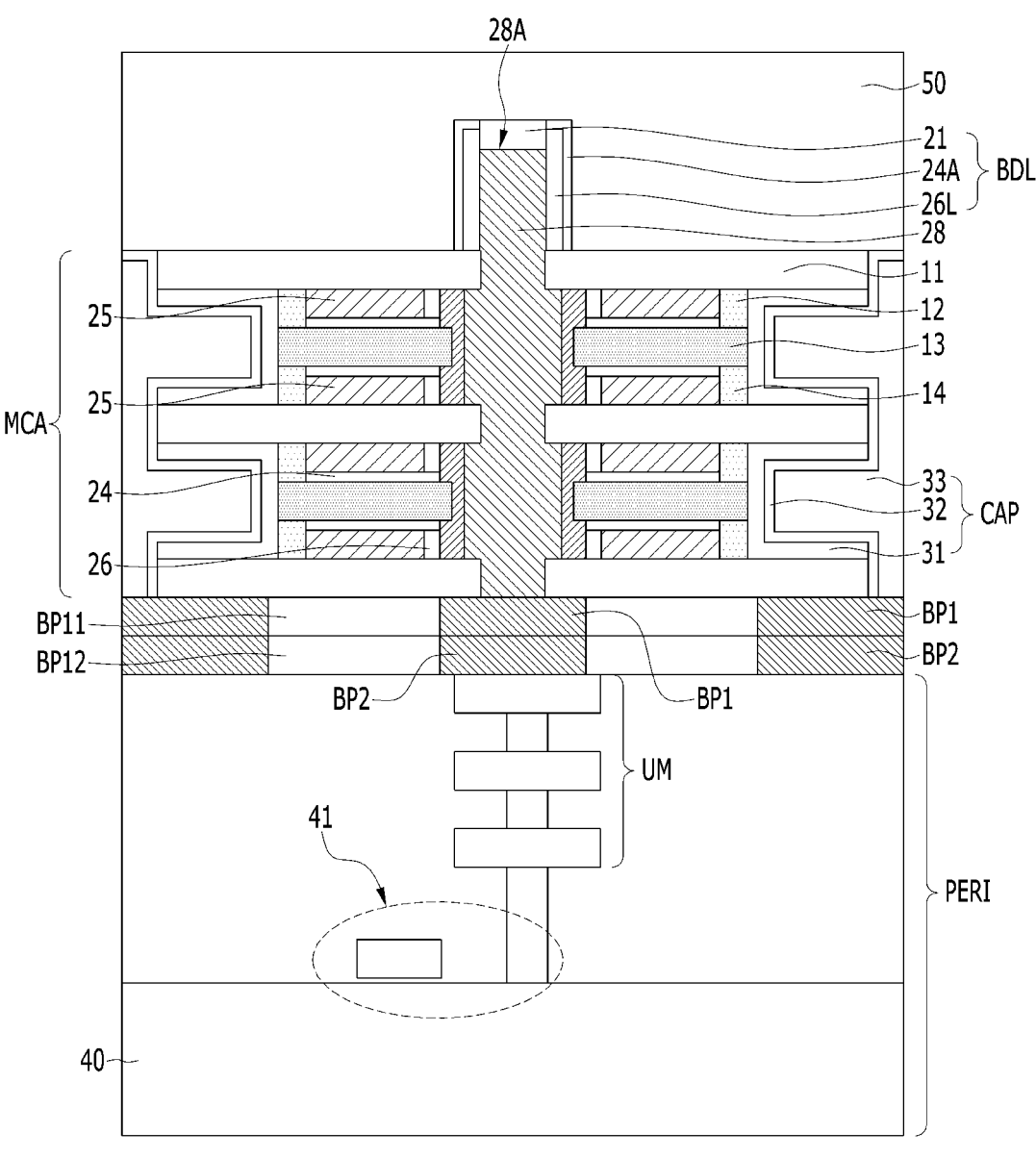

Referring to FIG. 23, a front dielectric layer 50 filling the space from which the first substrate 10 is removed may be formed. The front dielectric layer 50 may include silicon oxide. The front dielectric layer 50 may cover (or wraps around) the entire body dielectric layer BDL.

Figure 24:
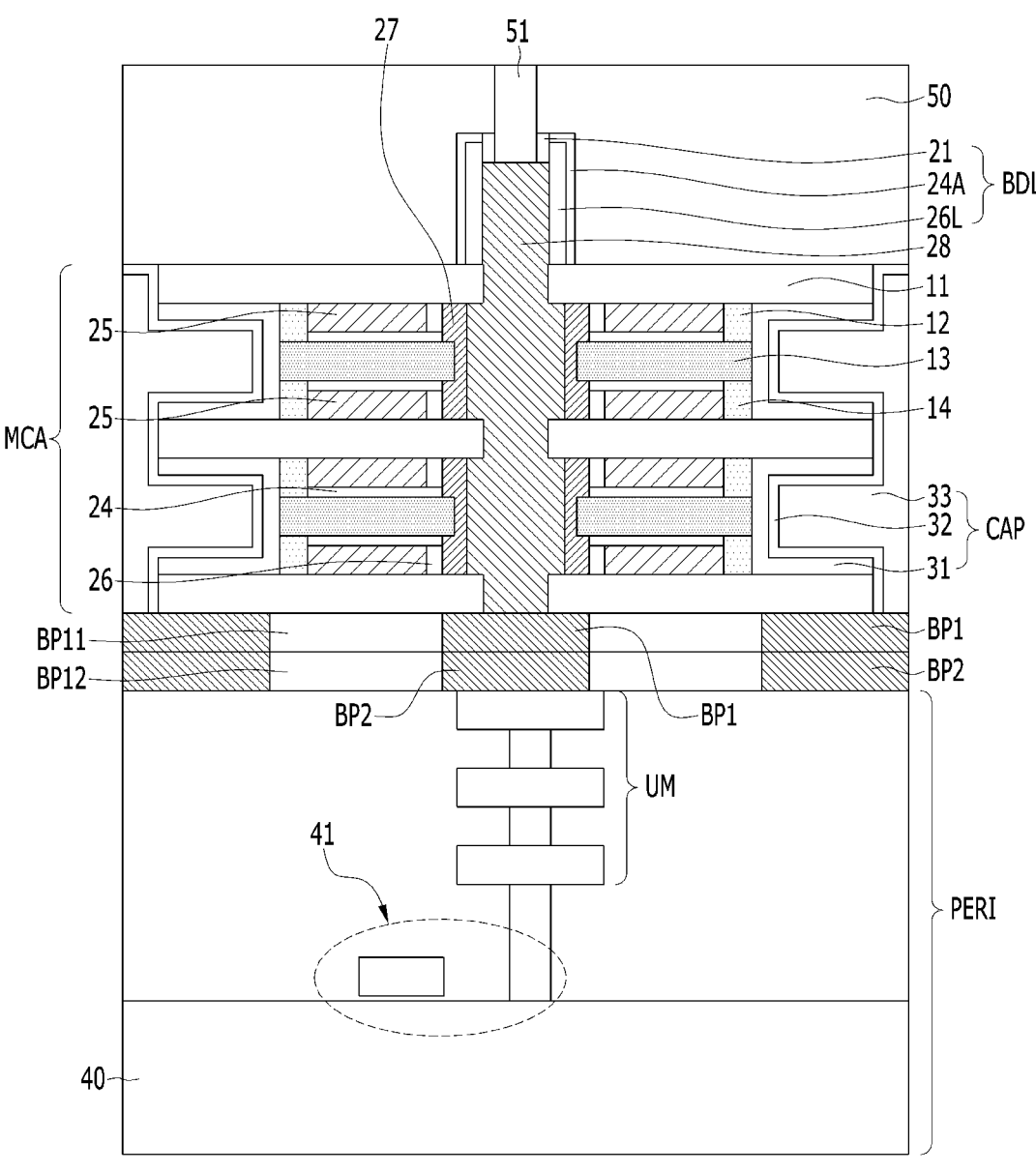

Referring to FIG. 24, a bit line pad 51 may be formed in the front dielectric layer 50 to couple with the bit line 28. The bit line pad 51 penetrates the front dielectric layer 50 and the body dielectric layer BDL (e.g., through the protective layer 21). The bit line pad 51 may include a metal-based material.

Referring to FIGS. 20 to 24, a semiconductor device may include a second substrate 40 having a peripheral circuit portion PERI; a memory cell array MCA including a vertical conductive line, such as a bit line 28 having a contact pad side 28A and a bonding pad side 28B; a first bonding pad BP1 coupled to the bonding pad side 28B; a second bonding pad BP2 disposed between and coupled to the peripheral circuit portion PERI and the first bonding pad BP1; a body dielectric layer BDL covering the contact pad side 28A; and a bit line pad 51 penetrating the body dielectric layer BDL and coupled to the contact pad side 28A.

Referring to FIGS. 20 to 24, the method for fabricating a semiconductor device may include forming a memory cell array MCA, where the memory cell array MCA includes a body dielectric layer BDL and a bit line 28, where the bit line 28 includes a contact pad side 28A covered by (or embedded in) the body dielectric layer BDL and a bonding pad side 28B distal to the contact pad side 28A and where the body dielectric layer BDL may include a body protective layer 21 covering the contact pad side 28A, a first body liner 24, and a second body liner 26L; forming a second substrate 40 including the peripheral circuit portion PERI; bonding the bonding pad side 28B to the peripheral circuit portion PERI; selectively removing the first substrate 10; and forming a bit line pad 51 coupled to the contact pad side 28A.

According to the embodiments of the present invention, the body dielectric layer BDL covering the vertical conductive lines (e.g., the bit line 28) may prevent electrical bridges between the neighboring vertical conductive lines, which may suppress leakage current to a substrate.

The effects desired to be obtained in the embodiments of the present invention are not limited to the effects mentioned above, and other effects not mentioned above may also be clearly understood by those of ordinary skill in the art to which the present invention pertains the description below.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a substrate;
a body recess in the substrate;
a body dielectric layer over the body recess;
an active layer extending in a direction parallel to the substrate over the substrate;
a contact node over an end portion of the active layer and perpendicular to the substrate; and
a conductive line coupled to the contact node and extended perpendicular to the substrate,
wherein the conductive line has a buried portion in the substrate,
wherein a sidewall and a bottom surface of the buried portion are surrounded by the body dielectric layer.

2. The semiconductor device of claim 1, wherein the active layer includes:
a channel; and
a source/drain region disposed on one side of the channel and coupled to the contact node.

3. The semiconductor device of claim 1, wherein the contact node has a height that fully covers the side of one end of one side of the active layer.

4. The semiconductor device of claim 1, wherein the contact node includes doped polysilicon.

5. The semiconductor device of claim 1, wherein the active layer includes monocrystalline silicon, polysilicon, germanium, silicon-germanium, Indium Gallium Zinc Oxide, or combinations thereof.

6. The semiconductor device of claim 1, further comprising:
a word line extending in a direction crossing the active layer over the active layer.

7. The semiconductor device of claim 1, wherein the word line includes a double word line, a single word line, or a gate all-around word line.

8. The semiconductor device of claim 1, wherein the conductive line includes a bit line.

9. The semiconductor device of claim 1, wherein the body dielectric layer includes a plurality of silicon oxides that are formed on a surface of the body recess.

10. A semiconductor device, comprising:
a body recess in a substrate;
a body dielectric layer over the body recess;
a transistor extending in a direction parallel to the substrate over the substrate and including an active layer having a first end portion and a second end portion;
a bit line contact node on a sidewall, an upper surface, and a lower surface of the first end portion;
a bit line coupled to the bit line contact node and extended perpendicular to the substrate;
a storage contact node on a sidewall, an upper surface, and a lower surface of the second end portion; and
a capacitor coupled to the second end portion and the storage contact node.

11. The semiconductor device of claim 10, wherein the active layer includes:
a channel;
a first source/drain region disposed on a first side of the channel and coupled to the bit line contact node; and
a second source/drain region disposed on a second side of the channel and coupled to the storage contact node.

12. The semiconductor device of claim 10, wherein each of the bit line contact node and the storage contact node includes doped polysilicon.

13. The semiconductor device of claim 10, wherein the active layer includes monocrystalline silicon, polysilicon, germanium, silicon-germanium or Indium Gallium Zinc Oxide.

14. The semiconductor device of claim 10, wherein the capacitor includes a cylindrical storage node coupled to the storage contact node.

15. The semiconductor device of claim 10, further comprising:
a word line extending in a direction crossing the active layer over the active layer.

16. The semiconductor device of claim 15, wherein the word line includes a double word line, a single word line, or a gate-all-around word line.

17. The semiconductor device of claim 10, wherein the body dielectric layer includes silicon oxide.

18. A semiconductor device, comprising:
a substrate including a peripheral circuit portion;
a memory cell array including a bit line, including a contact pad side and a bonding pad side, and extended perpendicular to the substrate;
a first bonding pad coupled to the bonding pad side of the bit line;
a second bonding pad disposed on the peripheral circuit portion and coupled to the first bonding pad;
a body dielectric layer covering the contact pad side of the bit line; and
a conductive pad passing through the body dielectric layer and coupled to the contact pad side of the bit line, wherein the contact pad side of the bit line has a protruding shape to be disposed at a higher level than the memory cell array.

19. The semiconductor device of claim 18, wherein the body dielectric layer includes silicon oxide.

* * * * *